United States Patent
Ma (10) Patent No.: US 10,134,316 B2
(45) Date of Patent: Nov. 20, 2018

(54) ARRAY SUBSTRATE, TESTING METHOD, DISPLAY PANEL AND DISPLAY APPARATUS

(71) Applicants: Shanghai Tianma Micro-Electronics Co., Ltd., Shanghai (CN); Tianma Micro-Electronics Co., Ltd., Shenzhen (CN)

(72) Inventor: Conghua Ma, Shanghai (CN)

(73) Assignees: SHANGHAI TIANMA MICRO-ELECTRONICS CO., LTD., Shanghai (CN); TIANMA MICRO-ELECTRONICS CO., LTD., Shenzhen (CN)

(*) Notice: Subject to any disclaimer, the term of this patent is extended or adjusted under 35 U.S.C. 154(b) by 133 days.

(21) Appl. No.: 15/004,843

(22) Filed: Jan. 22, 2016

(65) Prior Publication Data
US 2016/0293077 A1 Oct. 6, 2016

(30) Foreign Application Priority Data
Apr. 1, 2015 (CN) .......................... 2015 1 0153184

(51) Int. Cl.
*G01R 31/02* (2006.01)
*G09G 3/00* (2006.01)
(Continued)

(52) U.S. Cl.
CPC ........... *G09G 3/006* (2013.01); *G09G 3/3614* (2013.01); *H01L 27/124* (2013.01);
(Continued)

(58) Field of Classification Search
CPC ..... G06T 15/005; G06T 15/50; G06T 15/506; G06T 1/60; G01R 29/00; G09G 2352/00;
(Continued)

(56) References Cited

U.S. PATENT DOCUMENTS 9,614,001 B2 * 4/2017 Kawase ................. G09G 3/006
9,773,440 B2 * 9/2017 Yan ......................... G09G 3/006
(Continued)

FOREIGN PATENT DOCUMENTS

CN          1525217 A    9/2004
CN        101359107 A    2/2009
(Continued)

OTHER PUBLICATIONS

Chinese Application No. 201510153184.X, First Office Action dated Mar. 21, 2017.

*Primary Examiner* — Vinh Nguyen
(74) *Attorney, Agent, or Firm* — Alston & Bird LLP (57) ABSTRACT

The present disclosure provides an array substrate, a testing method, a display panel and a display apparatus. The array substrate includes: multiple gate wires and data wires intersecting with each other to divide multiple sub-pixel regions, where the sub-pixels corresponding to each of the data wires form a column of the sub-pixels, and M neighboring columns of the sub-pixels form a sub-pixel group; multiple switch units, where a first end of each of the switch units is electrically connected to one of the data wires; and multiple testing ends, each of which is electrically connected to second ends of the switch units. In such configuration, at least two switch units are electrically connected to the data wires corresponding to $i^{th}$ columns of the sub-pixels in at least two alternately arranged sub-pixel groups, respectively. Accordingly, impacts to voltage of common electrodes may be avoided and testing effect may be improved.

9 Claims, 8 Drawing Sheets

(51) Int. Cl.
*H01L 27/12* (2006.01)
*G09G 3/36* (2006.01)
*G02F 1/1333* (2006.01)
*G02F 1/1362* (2006.01)

(52) U.S. Cl.
CPC ...... *H01L 27/1222* (2013.01); *G02F 1/13338* (2013.01); *G02F 2001/136254* (2013.01); *G02F 2203/69* (2013.01); *G09G 2300/0426* (2013.01)

(58) Field of Classification Search
CPC ....... G09G 2360/122; G09G 2360/123; G09G 2360/128; G09G 3/001; G09G 5/30; G09G 5/39; G09G 5/391; G09G 5/393; G06F 3/0304; G06F 3/0325; G06F 3/0346; G06F 3/04842; H04N 7/183; H04N 21/44004; H04N 5/14; H04N 5/46; H04N 5/7416; H04N 7/01; H04N 7/012; H04N 7/0132; G11C 7/1042
See application file for complete search history.

(56) References Cited

U.S. PATENT DOCUMENTS

| | | |
|---|---|---|
| 2004/0179014 A1 | 9/2004 | Nakano et al. |
| 2009/0033590 A1 | 2/2009 | Feng |
| 2010/0110114 A1 | 5/2010 | Hashimoto |
| 2014/0132580 A1 | 5/2014 | Hu |
| 2016/0266675 A1 | 9/2016 | Yang et al. |

FOREIGN PATENT DOCUMENTS

| | | |
|---|---|---|
| CN | 101726898 A | 6/2010 |
| CN | 202533678 U | 11/2012 |
| CN | 103488019 A | 1/2014 |
| CN | 104020906 A | 9/2014 |

* cited by examiner

ARRAY SUBSTRATE, TESTING METHOD, DISPLAY PANEL AND DISPLAY APPARATUS

CROSS-REFERENCE TO RELATED APPLICATIONS

The present application claims priority to Chinese patent application No. 201510153184.X, filed on Apr. 1, 2015, and entitled "ARRAY SUBSTRATE, TESTING METHOD, DISPLAY PANEL AND DISPLAY APPARATUS" filed with the State Intellectual Property Office of the People's Republic of China, the entire disclosure of which is incorporated herein by reference.

TECHNICAL FIELD

The present disclosure generally relates to display technology field, and more particularly, to an array substrate, a testing method, a display panel and a display apparatus.

BACKGROUND

Liquid crystal display apparatus are currently a popular choice for flat-panel display apparatuses where an array substrate serves as an important role. When manufacturing a liquid crystal display apparatus, testing the array substrate is necessary for improving the yield. Generally, the array substrate is combined with a color film substrate to form a display panel, and then, a testing signal is supplied to the array substrate. Whether the array substrate is effective can be determined based on whether the display panel works normally or not. However, the current testing methods are not satisfying because voltages on common electrodes are unstable.

BRIEF SUMMARY OF THE INVENTION

Embodiments of the present disclosure provide an array substrate, a testing method, a display panel and a display apparatus.

According to one embodiment, an array substrate is provided, which may include: multiple sub-pixels arranged in a matrix form; multiple gate wires arranged in parallel and along a first direction, each of which is electrically connected to a row of the sub-pixels; multiple data wires arranged in parallel and along a second direction, each of which is electrically connected to a column of the sub-pixels; multiple switch units, each of which has a first end, a second end and a control end; and multiple testing ends.

Wherein, the first ends of the switch units are electrically connected to the data wires, respectively, and the control ends of the switch units are electrically connected to a control signal end.

Wherein, the sub-pixels are grouped into multiple sub-pixel groups, where in each of the sub-pixel groups, there are consecutive M columns of the sub-pixels and the sub-pixels arranged in the second direction possess different colors, where M is a positive integer not less than 2.

Wherein, each of the testing ends is electrically connected to the second ends of N switch units, and the N switch units are electrically connected to the data wires which are electrically connected to N columns of the sub-pixels, where N is a positive integer not less than 2.

Wherein, the N columns of the sub-pixels respectively belong to N sub-pixel groups which are alternately arranged, and serial numbers of the N columns of the sub-pixels in the N sub-pixel groups are same.

According to one embodiment, a testing method is provided, which is used for testing the array substrate. The testing method may include: turning on the switch units; scanning one of the gate wires; and during scanning the one of the gate wires, supplying testing signals to the sub-pixels through the testing ends, where the testing signals, supplied to two sub-pixels with a same serial number in two neighboring sub-pixel groups, possess opposite polarities. Specifically, number of the testing signals possessing positive polarity is equal to number of the testing signals possessing negative polarity.

In some embodiments, the testing signals supplied to any two neighboring sub-pixels in any sub-pixel groups may have opposite polarities.

According to one embodiment, a display panel including the array substrate is provided.

According to one embodiment, a display apparatus including the display panel is provided.

Embodiments of the present disclosure have following advantages.

In the array substrate provided in the embodiments of the present disclosure, multiple corresponding columns of the sub-pixels in alternately arranged sub-pixel groups are electrically connected to one testing end, that means corresponding columns of the sub-pixels in two adjacent sub-pixel groups are electrically connected to different testing ends. "Corresponding columns of the sub-pixels" are columns of the sub-pixels possess the same serial number in different sub-pixel groups. A testing signal with a polarity may be applied to each of the testing ends. In such configuration, when testing such array substrate, the corresponding columns of the sub-pixels in two adjacent sub-pixel groups may be provided with the testing signals with opposite polarities. As such, the number of the testing signals with positive polarity is equal to the number of the testing signals with negative polarity, which is benefit for improving the stability of the voltage on a common electrode. Therefore, the testing effect may be improved.

BRIEF DESCRIPTION OF THE DRAWINGS

The invention will become more fully understood from the following detailed description, taken in conjunction with the accompanying drawings, wherein like reference numerals refer to like element. The figures in the description below only illustrate the embodiments of the present disclosure. Without departing from the scope of the disclosure, those skilled in the art may acquire other figures based on the figures illustrated.

DETAILED DESCRIPTION

In order to clarify the present disclosure, embodiments of the present disclosure will be described in detail in conjunction with the accompanying drawings. The disclosure will be described with reference to certain embodiments. Accordingly, the present disclosure is not limited to the embodiments disclosed. It is understood by those skilled in the art that various changes may be made without departing from the spirit or scope of the disclosure.

In prior art, testing effectiveness of an array substrate may not be satisfying because pixel electrodes may affect voltage stability of common electrodes. Specifically, when testing the array substrate, no matter which type of image is being tested, testing signals with opposite polarities being supplied to multiple data wires may have different quantities. When the data wires input the testing signals to the common electrodes, the pixel electrodes with positive polarity and the pixel electrodes with negative polarity may be different in quantity, so that voltage interference to the common electrodes by the pixel electrodes may not be cancelled, which may result in the phenomenon of unsatisfying testing effect.

Accordingly, the present disclosure provides an array substrate, where the data wires corresponding to columns of sub-pixels with a same serial number in alternately arranged sub-pixel groups may be electrically connected to a same testing end, so that the voltage stability of the common electrodes is improved when testing the array substrate. Wherein, in each of the sub-pixel groups, each column of sub-pixels is assigned with a serial number. Wherein, two sub-pixel groups are alternately arranged, that is, two sub-pixel groups are not neighboring. For example, a first column of sub-pixels in a first sub-pixel group and a first column of sub pixels in a third sub-pixel group are electrically connected to a same testing end, where the first sub-pixel group and the third sub-pixel group are not neighboring. Specifically, in conjunction with the accompanying FIGS. 1 to 7, detailed descriptions of array substrates in various embodiments of the present disclosure are provided.

Figure 1:
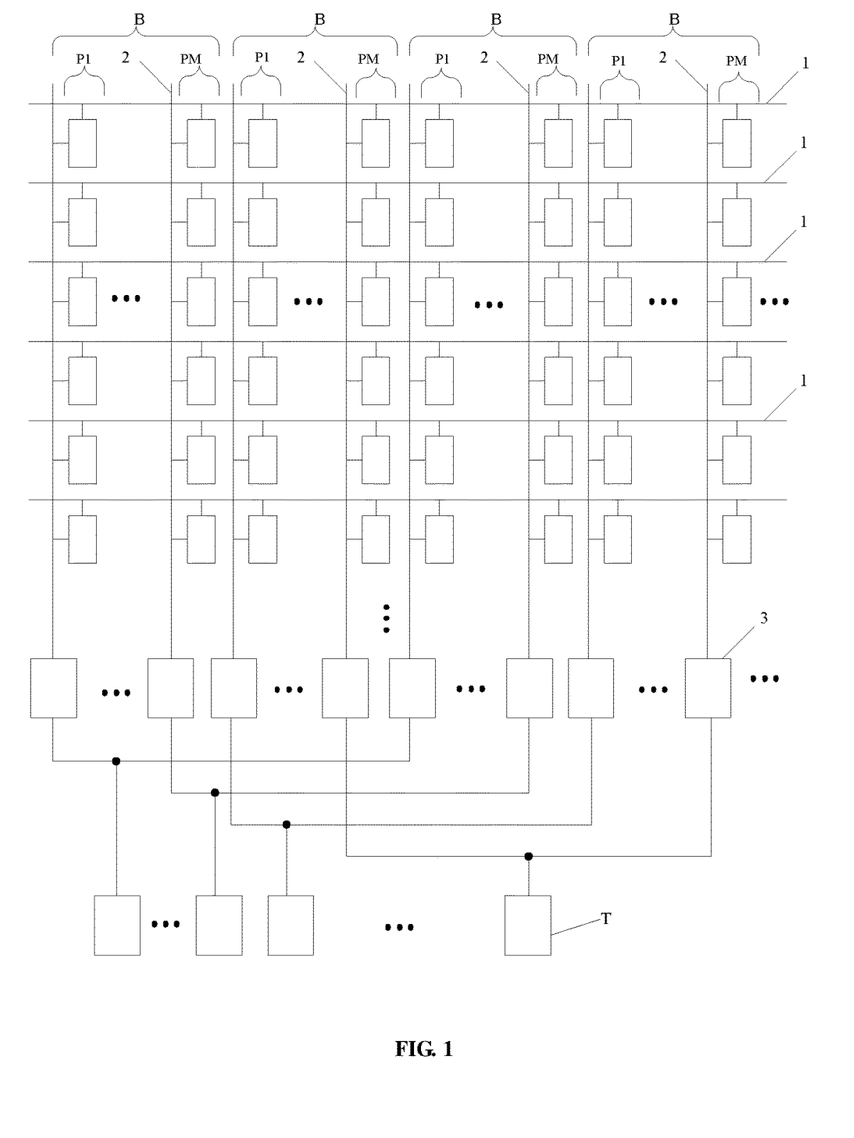
FIG. 1 schematically illustrates a structural diagram of an array substrate according to one embodiment of the present disclosure.

FIG. 1 schematically illustrates a structural diagram of an array substrate according to one embodiment of the present disclosure.

In one embodiment of the array substrate, multiple gate wires 1 are arranged in parallel and along a first direction, where the first direction is perpendicular to each of the gate wires 1 in a plane. Multiple data wires 2 are arranged in parallel and along a second direction, where the second direction is perpendicular to each of the data wires 2. The gates wires 1 intersect with the data wires 2 to divide multiple regions each of which includes a sub-pixel. The sub-pixels corresponding to each of the date wires 2 form a column of the sub-pixels. Neighboring M columns of the sub-pixels form a sub-pixel group B including a first column of the sub-pixels P1 to an $M^{th}$ column of the sub-pixels PM, where the sub-pixels arranged along the second direction in each sub-pixel group may have different colors. In some embodiments, M is a positive integer greater than or equal to 2. The array substrate as depicted in FIG. 1 further includes multiple switch units 3, where a first end of each switch unit is electrically connected to one of the data wires 2. The array substrate as depicted in FIG. 1, further includes multiple testing ends T, where each of the testing ends T is electrically connected to second ends of at least two switch units, and the at least two switch units are electrically connected to the data wires 2 corresponding to columns of the sub-pixels with a same serial number in at least two alternately arranged sub-pixel groups.

In each sub-pixel group, the M columns of sub-pixels are designated with M serial numbers. Along the second direction, the serial numbers are as follows: 1, 2, . . . M. In some embodiments, the serial numbers of the alternately arranged multiple sub-pixel groups constitute an arithmetic progression whose tolerance is 2.

Specifically, at least two alternately arranged sub-pixel groups represent that only one sub-pixel group may be set between at least two sub-pixel groups. In addition, the array substrate in the present disclosure may apply to a self-capacitance touch-display apparatus, and the array substrate may further include multiple touch-control electrodes and multiple touch-control electrode lead wires. The touch-control electrodes may be formed by dividing the common electrodes, and each of the touch-control electrode lead wires may be electrically connected to one of the touch-control electrodes. At a display stage, a common voltage may be supplied to the touch-control electrodes, and at touch-control stage, a touch-control operation detecting signal may be supplied to the touch-control electrodes.

A method for testing the array substrate is provided in the present disclosure. The method may include: turning on the switch units; scanning one of the gate wires; and during scanning the one of the gate wires, supplying testing signals to the sub-pixels through the testing ends. The testing signals that are supplied to two sub-pixels with a same serial number in two neighboring sub-pixel groups possess opposite polarities. Specifically, the number of the testing signals possessing positive polarity is equal to number of the testing signals possessing negative polarity.

If M is an odd number, the testing signals outputted from the testing ends respectively corresponding to the columns of the sub-pixels with a same serial number in the two neighboring sub-pixel groups have opposite polarities. When testing the array substrate, after inputting the testing signals to the pixel electrodes via the data wires, the pixel electrodes with positive polarity and the pixel electrodes with negative polarity may be close in distance between. Therefore, impacts caused by the pixel electrodes to the common electrodes may be quickly cancelled and guarantee a high voltage stability of the common electrodes.

In the present disclosure, when testing the array substrate, the following steps may be performed. First, turn on the switch units; second, scan one of the gate wires; and at least, during scanning the one of the gate wires, supply testing signals to the sub-pixels through the testing ends, where the testing signals that are supplied to two sub-pixels with a same serial number in two neighboring sub-pixel groups, possess opposite polarities. Specifically, number of the testing signals possessing positive polarity is equal to number of the testing signals possessing negative polarity. When scanning one of the gate wires, the testing ends output the testing signals, and the testing signals with positive polarity may be inputted to one half of the data wires and the testing signals with negative polarity may be inputted to the other half of the data wires. The data wires input signals to the pixel electrodes. Because the pixel electrodes with positive polarity and the pixel electrodes with negative polarity may be equal in quantity, impact to the common electrodes caused by the pixel electrodes with positive polarity and impact to the common electrodes caused by the pixel electrodes with negative polarity may cancel with each other. Thus, impact to voltage on the common electrodes caused by the pixel electrodes may be avoided, so that voltage stability of the common electrodes may be improved and furthermore, the testing effect may be improved.

Figure 2:
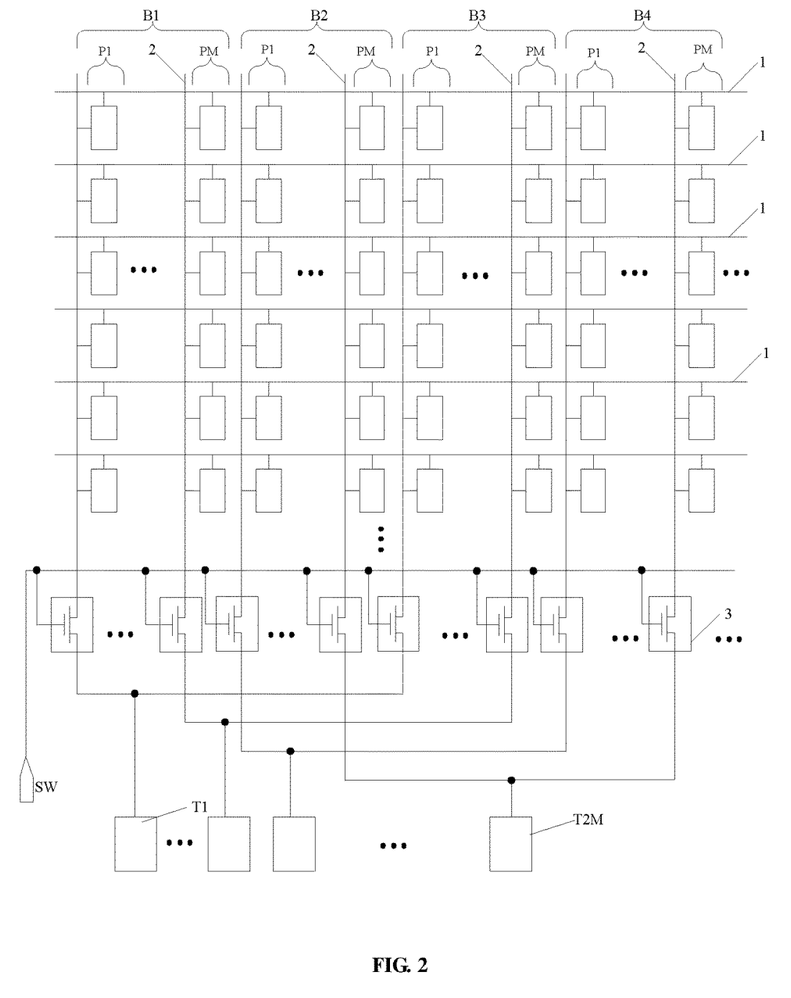
FIG. 2 schematically illustrates a structural diagram of an array substrate according to another embodiment of the present disclosure.

FIG. 2 schematically illustrates a structural diagram of an array substrate according to one embodiment of the present disclosure. The array substrate may include: multiple gate wires 1, multiple data wires 2, multiple switch units 3 and 2M testing ends including a first testing end T1 to a 2M$^{th}$ testing end T2M (not shown). The gate wires 1 intersect with the data wires 2 to divide multiple regions, each of which includes a sub-pixel. Neighboring M columns of the sub-pixels form a sub-pixel group, and N sub-pixel groups may be formed including a first sub-pixel group B1 to a N$^{th}$ sub-pixel group BN (not shown). In each sub-pixel group, the M columns of the sub-pixels may include a first sub-pixel column P1 to a M$^{th}$ sub-pixel column PM, and the first sub-pixel column P1 to the M$^{th}$ sub-pixel column PM in each sub-pixel group may have different colors. Each column of the sub-pixels corresponds to one of the date wires 2, and each of the date wires 2 is electrically connected to the first end of one of the switch units 3. The second end of the switch units corresponding to columns of the sub-pixels with a same serial number i in odd numbered sub-pixel groups (namely, the switch units are electrically connected to the data wires corresponding to the columns of the sub-pixels with a same serial number) are electrically connected to a testing end with the same serial number i. For example, second ends of the switch units corresponding to a first sub-pixel column in a first sub-pixel group B1 and a first sub-pixel column in a third sub-pixel group B3 are electrically connected to a first testing end T1. Second ends of the switch units corresponding to columns of the sub-pixels with the same serial number i in even numbered sub-pixel groups are electrically connected to a testing end with a serial number (i+M). For example, second ends of the switch units corresponding to a first sub-pixel column in a second sub-pixel group B2 and a first sub-pixel column in a fourth sub-pixel group B4 are electrically connected to a testing end with a serial number (M+1). The control end of each switch unit 3 is electrically connected to a corresponding control signal end.

In some embodiments, the switch units may be switching tubes with a same conductive type, where the switching tubes may be N type switching tubes or a P type switching tubes, and the switch units 3 is electrically connected to a control signal end SW entirely.

In some embodiments, the switching tubes may entirely be a same conductive type or a mix of different conductive types, which is designed based on actual situations.

In the embodiment depicted in FIG. 2, the switching tubes may be set in a non-display area in the present disclosure to avoid affecting an opening ratio of the array substrate.

When testing the array substrate, the multiple gate wires may be scanned one-by-one, and simultaneously the switch units may be entirely turned on by the control signal end SW so that the testing ends supply the testing signals to the data wires. The testing ends respectively corresponding to the columns of the sub-pixels with a same serial number in the two neighboring sub-pixel groups may simultaneously output the testing signals, and the testing ends outputting the testing signals with positive polarity and the testing ends outputting the testing signals with negative polarity may be equal in quantity.

When testing a color image corresponding to the columns of the sub-pixels with a same serial number alone, a testing end corresponding to the columns of the sub-pixels with the same serial number in the odd numbered sub-pixel groups may supply a first polarity testing signal. The testing end corresponding to the columns of the sub-pixels the same serial number in even numbered sub-pixel groups may supply a second polarity testing signal, and the remaining columns of the sub-pixels may supply no testing signal, where the first polarity and the second polarity are opposite.

In another embodiment, when testing a gray scale image, the testing ends supply all of the testing signals, and the testing ends supplying the first polarity testing signal and the testing ends supplying the second polarity testing signals are equal in quantity.

In some embodiments, the first polarity and the second polarity are opposite.

In one embodiment, when M is 2, the first sub-pixel column may include a first color sub-pixel and a second color sub-pixel arranged alternately, and the second sub-pixel column may include a third color sub-pixel and a fourth color sub-pixel arranged alternately. The first color sub-pixel, the second color sub-pixel, the third color sub-pixel, and the fourth color sub-pixel may have different colors, which may respectively be one of a red sub-pixel, a green sub-pixel, a blue sub-pixel and a white sub-pixel.

In another embodiment, when M is 3, the first sub-pixel column may include multiple first color sub-pixels, the second sub-pixel column may include multiple second color sub-pixels and the third sub-pixel column may include multiple third color sub-pixels. The first color sub-pixel, the second color sub-pixel and the third color sub-pixel may have different colors, which may respectively be one of a red sub-pixel, a green sub-pixel and a blue sub-pixel. Specifically, colors may be formed directly on the array substrate or may be formed on other substrates, where the colors correspond to the color sub-pixels.

Figure 3A:
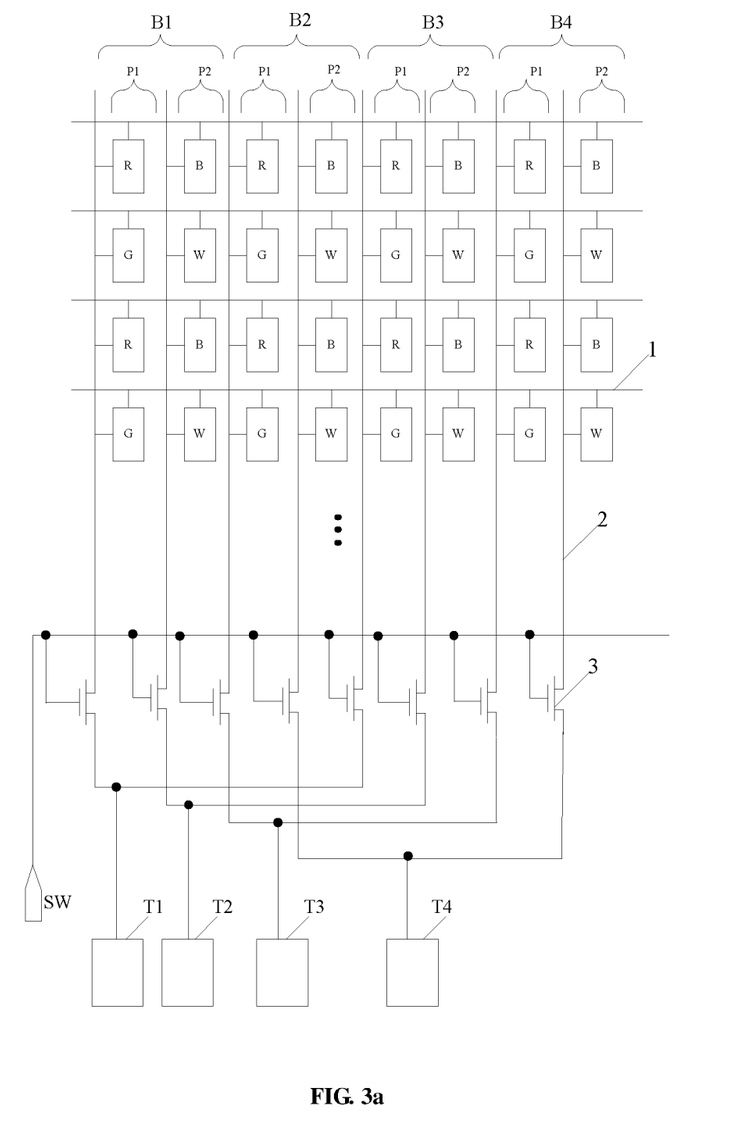
FIG. 3a schematically illustrates a structural diagram of an array substrate according to another embodiment of the present disclosure.

FIG. 3a schematically illustrates a structural diagram of an array substrate according to another embodiment of the present disclosure.

In this embodiment, the array substrate includes four sub-pixel groups each of which includes two columns of the sub-pixels. The array substrate may include: multiple gate wires 1, multiple data wires 2, multiple switch units 3 and multiple testing ends including a first testing end T1 to a fourth testing end T4. The multiple switch units 3 are switching tubes with a same conductive type. The gate wires 1 intersect with the data wires 2 to divide multiple regions, each of which includes a sub-pixel. Two neighboring columns of the sub-pixels form a sub-pixel group so that sub-pixel groups B1 to B4 are formed. Two columns of the sub-pixels in each sub-pixel group are set including a first sub-pixel column P1 and a second sub-pixel column P2. The first sub-pixel column P1 includes multiple red sub-pixels R and multiple green sub-pixels G arranged alternately, and the second sub-pixel column P2 includes the multiple blue sub-pixels B and multiple white sub-pixels W arranged alternately. Each of the columns of the sub-pixels corresponds to one of the date wires, and each of the date wires is electrically connected to a first end of one of the switch units 3. The second ends of the switch units 3 corresponding to columns of the sub-pixels with a same serial number i in the first sub-pixel group B1 and the third sub-pixel group B3 are electrically connected to a testing end with the same serial number i. Second ends of the switch units 3 corresponding to columns of the sub-pixels with the same serial number i in the second sub-pixel group B2 and the fourth sub-pixel group B4 are electrically connected to a testing end with a serial number (i+2). The control ends of the switch units 3 are electrically connected to a same control signal end SW.

When testing a red and green mixed image on the array substrate shown in FIG. 3*a*, as presented in Table 1.

TABLE 1

| R/G | B/W | R/G | B/W | R/G | B/W | R/G | B/W |
|---|---|---|---|---|---|---|---|
| + | 0 | − | 0 | + | 0 | − | 0 |
| + | 0 | − | 0 | + | 0 | − | 0 |
| + | 0 | − | 0 | + | 0 | − | 0 |
| + | 0 | − | 0 | + | 0 | − | 0 |
| + | 0 | − | 0 | + | 0 | − | 0 |
| ... | ... | ... | ... | ... | ... | ... | ... |

The multiple gate wires may be scanned one-by-one, and the switch units may be entirely turned on by the control signal end SW. The first testing end T1 supplies a testing signal with positive polarity, the third testing end T3 supplies a testing signal with negative polarity, and the remaining testing ends supply no testing signal which is represented as 0, where the testing signals may be inputted into the pixel electrodes corresponding to the sub-pixels via the data wires, and Table 1 is acquired which presents allocation of signal polarity of the pixel electrodes. As shown in Table 1, the pixel electrodes with positive polarity and the pixel electrodes with negative polarity are equal in quantity, and the impacts to the common electrodes may be cancelled so as to guarantee voltage stability of the common electrodes.

Similarly, when testing a blue and white mixed image on the array substrate as shown in FIG. 3*a*, Table 2 is acquired which presents allocation of signal polarity of the pixel electrodes.

TABLE 2

| R/G | B/W | R/G | B/W | R/G | B/W | R/G | B/W |
|---|---|---|---|---|---|---|---|
| 0 | + | 0 | − | 0 | + | 0 | − |
| 0 | + | 0 | − | 0 | + | 0 | − |
| 0 | + | 0 | − | 0 | + | 0 | − |
| 0 | + | 0 | − | 0 | + | 0 | − |
| 0 | + | 0 | − | 0 | + | 0 | − |
| ... | ... | ... | ... | ... | ... | ... | ... |

In addition, when testing a grey scale image on the array substrate shown in FIG. 3*a*, as presented in Table 3.

TABLE 3

| R/G | B/W | R/G | B/W | R/G | B/W | R/G | B/W |
|---|---|---|---|---|---|---|---|
| + | − | + | − | + | − | + | − |
| + | − | + | − | + | − | + | − |
| + | − | + | − | + | − | + | − |
| + | − | + | − | + | − | + | − |
| + | − | + | − | + | − | + | − |
| ... | ... | ... | ... | ... | ... | ... | ... |

The multiple gate wires may be one-by-one scanned, and the switch units may be entirely turned on via the control signal end SW. The first testing end T1 supplies a testing signal with positive polarity, the third testing end T3 supplies a testing signal with positive polarity, and two neighboring testing ends supply the testing signals with opposite polarities, where the testing signals may be inputted into the pixel electrodes corresponding to the sub-pixels via the data wires. Table 3 is acquired which presents allocation of signal polarity of the pixel electrodes. As shown in Table 3, the pixel electrodes with positive polarity and the pixel electrodes with negative polarity are equal in quantity, and the impacts to the common electrodes may be cancelled so as to guarantee voltage stability of the common electrodes.

Figure 3B:
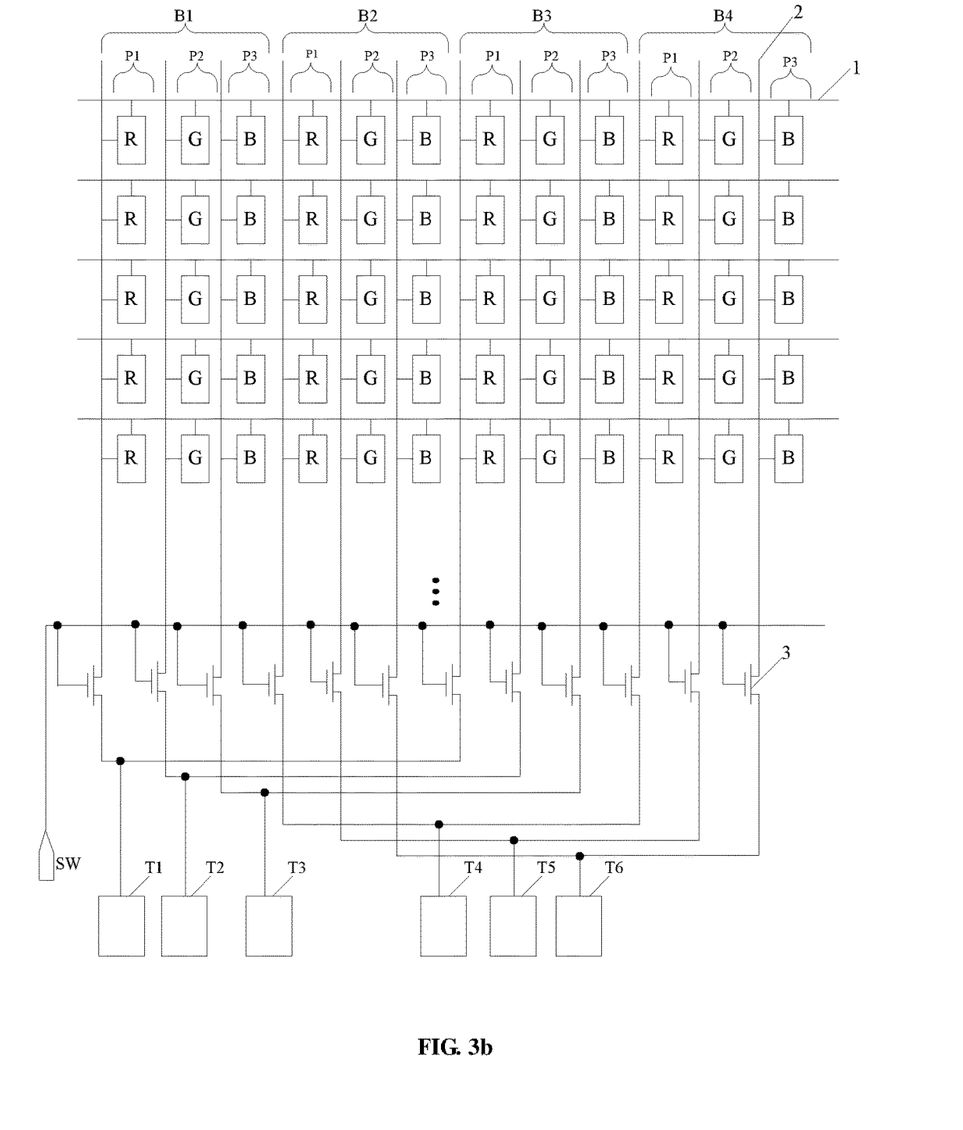
FIG. 3b schematically illustrates a structural diagram of an array substrate according to another embodiment of the present disclosure.

FIG. 3*b* schematically illustrates a structural diagram of an array substrate according to another embodiment of the present disclosure.

In this embodiment, the array substrate includes four sub-pixel groups, each of which includes three columns of the sub-pixels. The array substrate may include: multiple gate wires 1, multiple data wires 2, multiple switch units 3 and multiple testing ends including a first testing end T1 to a sixth testing end T6. Wherein, the multiple switch units 3 are switching tubes with a same conductive type. Wherein, the gate wires 1 intersect with the data wires 2 to divide multiple regions, each of which include a sub-pixel. Three neighboring columns of the sub-pixels form a sub-pixel group so that sub-pixel groups B1 to B4 are formed. Wherein, three columns of the sub-pixels in each sub-pixel group are set including a first sub-pixel column P1 to a third sub-pixel column P3. And, sub-pixels in the first sub-pixel column P1 are entirely red sub-pixels R, sub-pixels in the second sub-pixel column P2 are entirely green sub-pixels G and sub-pixels in the third sub-pixel column P3 are entirely blue sub-pixels B. Each of the columns of the sub-pixels corresponds to one of the date wires, and each of the date wires is electrically connected to a first end of one of the switch units 3. Second ends of the switch units corresponding to columns of the sub-pixels with a same serial number i in the first sub-pixel group B1 and the third sub-pixel group B3 are electrically connected to a testing end with the same serial number i. And, second ends of the switch units corresponding to columns of the sub-pixels with the same serial number i in the second sub-pixel group B2 and the fourth sub-pixel group B4 are electrically connected to a testing end with a serial number (i+3). The control ends of the switch units 3 are electrically connected to a same control signal end SW.

When testing a red image on the array substrate shown in FIG. 3*b*, as presented in Table 4.

TABLE 4

| R | G | B | R | G | B | R | G | B | R | G | B |
|---|---|---|---|---|---|---|---|---|---|---|---|
| + | 0 | 0 | − | 0 | 0 | + | 0 | 0 | − | 0 | 0 |
| + | 0 | 0 | − | 0 | 0 | + | 0 | 0 | − | 0 | 0 |
| + | 0 | 0 | − | 0 | 0 | + | 0 | 0 | − | 0 | 0 |
| + | 0 | 0 | − | 0 | 0 | + | 0 | 0 | − | 0 | 0 |
| + | 0 | 0 | − | 0 | 0 | + | 0 | 0 | − | 0 | 0 |
| ... | ... | ... | ... | ... | ... | ... | ... | ... | ... | ... | ... |

The multiple gate wires may be one-by-one scanned, and the switch units may be entirely turned on via the control signal end SW. The first testing end T1 supplies a testing signal with positive polarity, the fourth testing end T4 supplies a testing signal with negative polarity, and the remaining testing ends supply no testing signal which is represented as 0, where the testing signals may be inputted into the pixel electrodes corresponding to the sub-pixels via the data wires. Table 4 is acquired which presents allocation of signal polarity of the pixel electrodes. As shown in Table 4, the pixel electrodes with positive polarity and the pixel electrodes with negative polarity are equal in quantity, thus the impacts to the common electrodes may be cancelled so as to guarantee voltage stability of the common electrodes.

Similarly, when testing a green image on the array substrate as shown in FIG. 3b, Table 5 is acquired which presents allocation of signal polarity of the pixel electrodes.

TABLE 5

| R | G | B | R | G | B | R | G | B | R | G | B |
|---|---|---|---|---|---|---|---|---|---|---|---|
| 0 | + | 0 | 0 | − | 0 | 0 | + | 0 | 0 | − | 0 |
| 0 | + | 0 | 0 | − | 0 | 0 | + | 0 | 0 | − | 0 |
| 0 | + | 0 | 0 | − | 0 | 0 | + | 0 | 0 | − | 0 |
| 0 | + | 0 | 0 | − | 0 | 0 | + | 0 | 0 | − | 0 |
| 0 | + | 0 | 0 | − | 0 | 0 | + | 0 | 0 | − | 0 |
| ... | ... | ... | ... | ... | ... | ... | ... | ... | ... | ... | ... |

Similarly, when testing a blue image on the array substrate as shown in FIG. 3b, Table 6 is acquired which presents allocation of signal polarity of the pixel electrodes.

TABLE 6

| R | G | B | R | G | B | R | G | B | R | G | B |
|---|---|---|---|---|---|---|---|---|---|---|---|
| 0 | 0 | + | 0 | 0 | − | 0 | 0 | + | 0 | 0 | − |
| 0 | 0 | + | 0 | 0 | − | 0 | 0 | + | 0 | 0 | − |
| 0 | 0 | + | 0 | 0 | − | 0 | 0 | + | 0 | 0 | − |
| 0 | 0 | + | 0 | 0 | − | 0 | 0 | + | 0 | 0 | − |
| 0 | 0 | + | 0 | 0 | − | 0 | 0 | + | 0 | 0 | − |
| ... | ... | ... | ... | ... | ... | ... | ... | ... | ... | ... | ... |

In addition, when testing a grey scale image on the array substrate shown in FIG. 3b, as presented in Table 7.

TABLE 7

| R | G | B | R | G | B | R | G | B | R | G | B |
|---|---|---|---|---|---|---|---|---|---|---|---|
| + | − | + | − | + | − | + | − | + | − | + | − |
| + | − | + | − | + | − | + | − | + | − | + | − |
| + | − | + | − | + | − | + | − | + | − | + | − |
| + | − | + | − | + | − | + | − | + | − | + | − |
| + | − | + | − | + | − | + | − | + | − | + | − |
| ... | ... | ... | ... | ... | ... | ... | ... | ... | ... | ... | ... |

The multiple gate wires may be one-by-one scanned, and the switch units may be entirely turned on via the control signal end SW. The first testing end T1 supplies a testing signal with positive polarity, and the fourth testing end T4 supplies a testing signal with negative polarity. The two neighboring testing ends supply the testing signals with opposite polarities, where the testing signals may be inputted into the pixel electrodes corresponding to the sub-pixels via the data wires. Table 7 is acquired which presents allocation of signal polarity of the pixel electrodes. As shown in Table 7, the pixel electrodes with positive polarity and the pixel electrodes with negative polarity are equal in quantity, thus the impacts to the common electrodes may be cancelled so as to guarantee voltage stability of the common electrodes.

Furthermore, the array substrate in the embodiments of the present disclosure is not limited. In the following, a detailed description of the array substrate, which is suitable to the present disclosure, is provided in conjunction with FIGS. 4 to 7.

Figure 4:
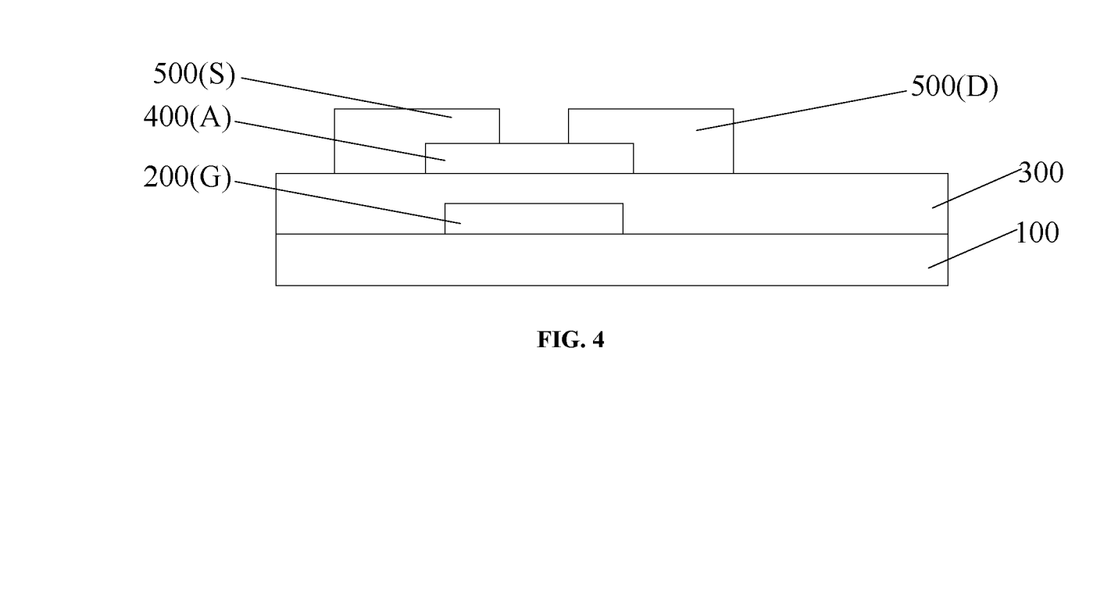
FIG. 4 schematically illustrates a structural diagram of an array substrate according to another embodiment of the present disclosure.

An array substrate may be a bottom gate type array substrate or a top gate type array substrate. FIG. 4 schematically illustrates a structural diagram of an array substrate according to another embodiment in the present disclosure.

The array substrate is a bottom gate type array substrate, and the array substrate may include a substrate 100. A first conductive layer 200 is formed on any surface of the substrate 100, where the first conductive layer 200 may include a gate wire and a gate G. A gate dielectric layer 300 is formed on a first surface of the first conductive layer 200, where the first surface is opposite to a second surface of the first conductive layer 200, which faces the substrate 100. A semiconductor layer 400 is formed on a first surface of the gate dielectric layer 300, where the first surface is opposite to a second surface of the gate dielectric layer 300, which faces the substrate 100. Specifically, the semiconductor layer 400 may include an active region A. A second conductive layer 500 is formed on a first surface of the semiconductor layer 400, where the first surface is opposite to a second surface of the semiconductor layer 400, which faces the substrate 100. Specifically, the second conductive layer 500 may include a data wire, a source S and a drain D. And, the gate G, active region A, source S and drain D forms a thin-film transistor.

Figure 5:
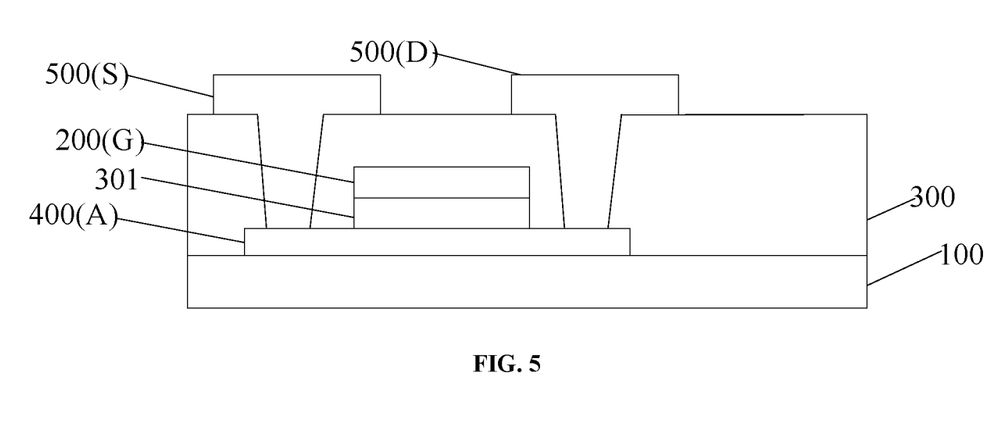
FIG. 5 schematically illustrates a structural diagram of an array substrate according to another embodiment of the present disclosure.

FIG. 5 schematically illustrates a structural diagram of an array substrate according to another embodiment in the present disclosure, and the array substrate is a top gate type array substrate.

The array substrate may include a substrate 100. A semiconductor layer 400 is formed on any surface of the substrate 100, where the semiconductor layer may include an active region A. A gate dielectric layer 300 is formed on a first surface of the semiconductor layer 400, where the first surface is opposite to a second surface of the semiconductor layer 400, which faces the substrate 100. A gate insulating layer 301 is formed on the first surface of the semiconductor layer 400, where the first surface is opposite to the second surface of the semiconductor layer 400, which faces the substrate 100. A first conductive layer 200 is formed on a first surface of the gate insulating layer 301, where the first surface is opposite to a second surface of the gate insulating layer 301, which faces the substrate 100. Specifically, the first conductive layer 200 may include a gate wire and a gate G A second conductive layer 500 is formed on a first surface of the gate dielectric layer 300, where the first surface is opposite to a second surface of the gate dielectric layer 300, which faces the substrate 100. Specifically, the second conductive layer 500 may include a data wire, a source S and a drain D. And, the gate G, active region A, source S and drain D forms a thin-film transistor.

Furthermore, position of a common electrode and position of a pixel electrode on the array substrate in the present disclosure are not limited. Specifically, based on the array substrate shown in FIG. 4 or 5 in conjunction with FIGS. 6 and 7, a description of the position of the common electrode and the position of the pixel electrode on the array substrate are provided.

Figure 6:
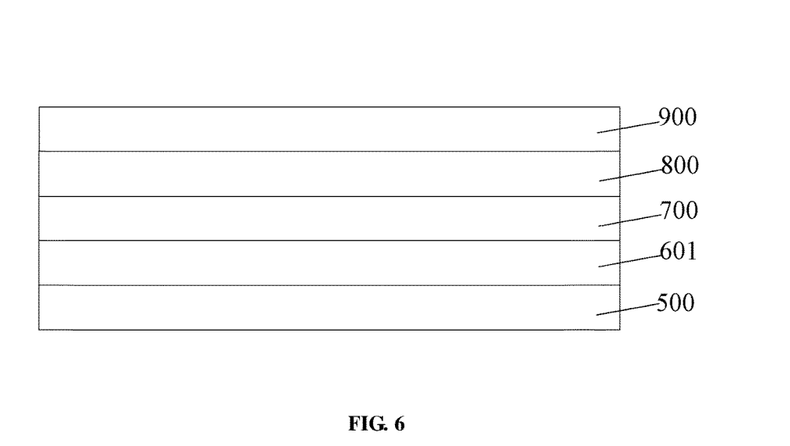
FIG. 6 schematically illustrates a structural diagram of an array substrate according to another embodiment of the present disclosure.

FIG. 6 schematically illustrates a structural diagram of an array substrate according to another embodiment of the present disclosure.

The array substrate may include following components. A first insulating layer 601 is formed on a first surface of the second conductive layer 500, where the first surface is opposite to a second surface of the second conductive layer 500, which faces the substrate 100. A first electrode 700 is formed on a first surface of the first insulating layer 601, where the first surface is opposite to a second surface of the first insulating layer 601, which faces the substrate 100. A second insulating layer 800 is formed on a first surface of the first electrode 700, where the first surface is opposite to a second surface of the first electrode 700, which faces the substrate 100. And, a second electrode 900 is formed on a first surface of the second insulating layer 800, where the first surface is opposite to a second surface of the second insulating layer 800, which faces the substrate 100.

Figure 7:
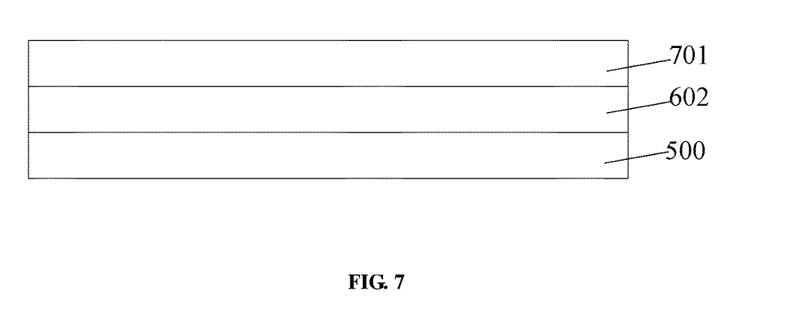
FIG. 7 schematically illustrates a structural diagram of an array substrate according to another embodiment of the present disclosure.

Furthermore, the common electrode and the pixel electrode may be on a same conductive layer on the array substrate in the present disclosure. FIG. 7 schematically illustrates a structural diagram of an array substrate according to another embodiment of the present disclosure.

The array substrate may include following components. A third insulating layer 602 is formed on a first surface of the second conductive layer 500, where the first surface is opposite to a second surface of the second conductive layer 500, which faces the substrate 100. And, an electrode driving layer 701 is formed on a first surface of the third insulating layer 602, where the first surface is opposite to a second surface of the third insulating layer 602, which faces the substrate 100. Wherein, the electrode driving layer 701 may possess the common electrode and the pixel electrode.

Figure 8:
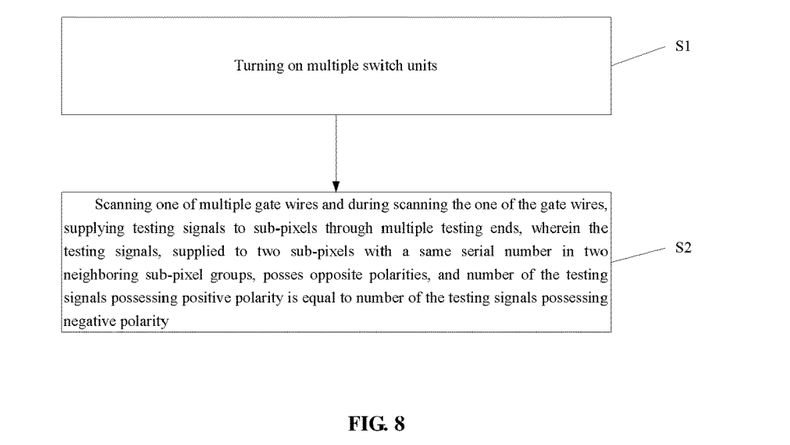
FIG. 8 schematically illustrated a flow diagram of a testing method according to one embodiment of the present disclosure.

Based on the array substrate in any one of the embodiments, a testing method is provided. FIG. 8 schematically illustrated a flow diagram of the testing method.

The method may be used for testing the array substrate in any one of the embodiments, which may include following steps. S1: turn on the switch units; S2: scan one of the gate wires, and during scanning the one of the gate wires, supply the testing signals to the sub-pixels through the testing ends. Wherein the testing signals, supplied to two sub-pixels with a same serial number in two neighboring sub-pixel groups, possess opposite polarities. Specifically, number of the testing signals possessing positive polarity is equal to number of the testing signals possessing negative polarity. Thus, the testing signals supplied by the testing ends corresponding to two neighboring columns of the sub-pixels in each sub-pixel group have opposite polarities.

Figure 9:
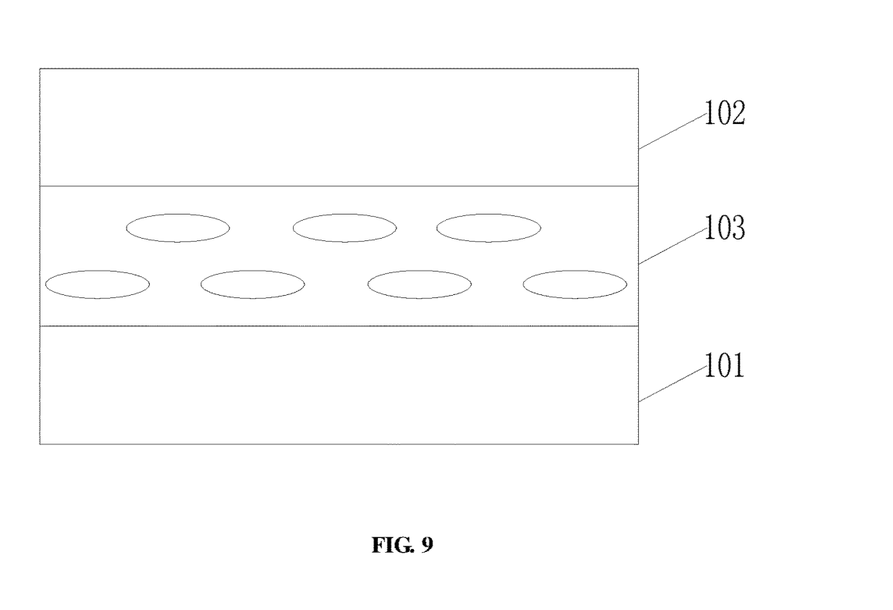
FIG. 9 schematically illustrated a structural diagram of a display panel according to one embodiment of the present disclosure.

A display panel is provided in the present disclosure. FIG. 9 schematically illustrated a structural diagram of the display panel in the present disclosure. The display panel may include the array substrate 101 in any one of the embodiments and a color film substrate 102. The display panel may further include a liquid crystal layer 103 set between the array substrate 101 and the color film substrate 102.

Figure 10:
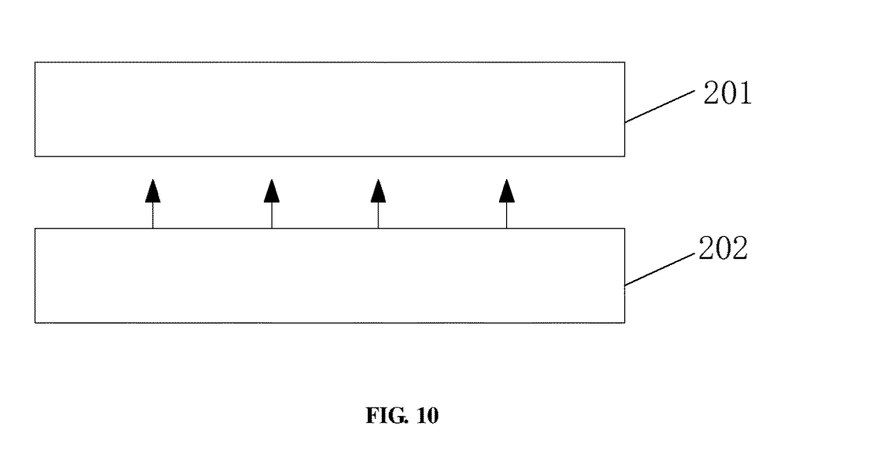
FIG. 10 schematically illustrated a structural diagram of a display apparatus according to one embodiment of the present disclosure.

A display apparatus is provided in the present disclosure. FIG. 10 schematically illustrated a structural diagram of the display apparatus in the present disclosure. The display apparatus may include the provided display panel 201 and a backlight module 202 formed on a light-facing surface of the display panel 201.

The present disclosure provides an array substrate, a testing method, a display panel and a display apparatus.

The array substrate may include multiple gate wires arranged in parallel along a first direction, and multiple data wires arranged in parallel along a second direction, where the gates wires may intersect with the data wires to divide multiple regions, each of which includes a sub-pixel. The sub-pixels corresponding to each of the data wires may form a column of the sub-pixels. M neighboring columns of the sub-pixels may form a sub-pixel group including a first sub-pixel column to a $M^{th}$ sub-pixel column. The sub-pixels arranged along the second direction in each sub-pixel group may be in different colors, where M is positive integer greater than or equal to 2.

The array substrate may further include multiple switch units, where a first end of each of the switch units may be electrically connected to each of the data wires, and a control end of each of the switch units may be electrically connected to a control signal end.

The array substrate may further include multiple testing ends, each of which may be electrically connected to second ends of at least two of the switch units. At least two of the switch units may be electrically connected to the data wires corresponding to the columns of the sub-pixels with a same serial number in alternately arranged at least two sub-pixel groups, respectively.

The present disclosure provides a testing method including following steps. First step is turning on the multiple switch units. And, second step is scanning one of the multiple gate wires. During scanning the one of the gate wires, supplying the testing signals to the sub-pixels through the testing ends, where the testing signals, supplied to two sub-pixels with a same serial number in two neighboring sub-pixel groups, possess opposite polarities. Number of the testing signals possessing positive polarity is equal to number of the testing signals possessing negative polarity. Namely, when scanning one of the data wires, the testing ends supply the testing signals, where the testing signals with positive polarity may be inputted to one half of the multiple data wires and the testing signals with negative polarity may be inputted to the other half of the multiple data wires. Thus, impacts to voltage of the common electrodes caused by pixel electrodes may be avoided, thus voltage stability of the common electrodes is improved so that the testing effect is improved.

The present disclosure is disclosed, but not limited, by preferred embodiments as above, and thus, those skilled in the art can achieve or implement the present disclosure. Based on the disclosure of the present disclosure, those skilled in the art can make any variation and modification without departing from the scope of the disclosure. Therefore, any simple modification, variation and polishing based on the embodiments described herein is within the scope of the present disclosure.

What is claimed is:
1. An array substrate, comprising:
a plurality of sub-pixels arranged in rows and columns of a matrix form, wherein the plurality of sub-pixels each is associated with one of four colors: red, green, blue and white;
a plurality of gate wires arranged in row direction, wherein the plurality of gate wires each is electrically connected to an associated sub-pixel row of the plurality of sub-pixels; a plurality of data wires arranged in column direction, wherein the plurality of data wires each is electrically connected to an associated sub-pixel column of the plurality of sub-pixels;
a control end providing a control signal;
a plurality of testing ends providing testing signals; and a plurality of switch units each associated with one sub-pixel column, and each comprising a first end, a second end and a control end, wherein the first end of each switch unit is electrically connected to the associated data wire, wherein the control end of each switch unit is electrically connected to the control signal from the control end;
wherein the plurality of sub-pixels is divided into K sub-pixel groups $B_k$, each comprising M sub-pixel columns ($B_{k1}, B_{k2}, \ldots, B_{kM}$), wherein K is an integer not less than 4, M is an integer not less than 2, and k takes each integer value in a range from 1 to K, inclusively, and wherein two sub-pixels of the plurality of sub-pixels in one row and from two adjacent columns are associated with two different of the four colors;

wherein the second ends of two switch units associated with two sub-pixel columns ($B_{ji}$, $B_{(j+2)i}$) are electrically connected to a same testing end; and wherein the second ends of two switch units associated with two sub-pixel columns ($B_{ji}$, $B_{(j+1)i}$) are electrically connected to two different testing ends, wherein j takes each integer value in a range from 1 to K−2, inclusively, and i takes each integer value in a range from 1 to M, inclusively.

2. The array substrate according to claim 1, wherein, M is an odd number, and wherein, testing signals supplied from the two testing ends corresponding to the two $i^{th}$ columns, which respectively belong to the $j^{th}$ group and the $(j+1)^{th}$ group, have opposite polarities.

3. The array substrate according to claim 1, wherein the plurality of sub-pixels form 2×2 blocks each having four sub-pixels of the four colors, when M is 2.

4. The array substrate according to claim 1, wherein the plurality of sub-pixels form 3×1 blocks each having three sub-pixels of three different of the four colors, when M is 3.

5. The array substrate according to claim 1, wherein the plurality of switch units comprises switches with a same conductive type.

6. The array substrate according to claim 1, further comprising:

a plurality of touch-control electrodes and a plurality of touch-control electrode lead wires, where the touch-control electrodes are formed by dividing common electrodes, and each of the touch-control electrode lead wires is electrically connected to one of the touch-control electrodes, wherein a common voltage is supplied to the touch-control electrodes at a display stage, and a touch-control detecting signal is supplied to the touch-control electrodes at a touch-control stage.

7. The array substrate according to claim 1, further comprising:

a substrate;

a first conductive layer formed on any surface of the substrate, wherein the first conductive layer comprises a gate;

a gate dielectric layer formed on the first conductive layer;

a semiconductor layer formed on the gate dielectric layer wherein the semiconductor layer comprises an active region; and a second conductive layer containing the plurality of data wires formed on the semiconductor layer, wherein the second conductive layer comprises a source and a drain, and wherein the gate, the active region, the source and the drain form a thin-film transistor in each of the sub-pixel of the plurality of sub-pixels.

8. A display panel, comprising the array substrate according to claim 1.

9. A display apparatus, comprising the display panel according to claim 8.

* * * * *